United States Patent [19]
Bader et al.

[11] Patent Number: 5,245,299
[45] Date of Patent: Sep. 14, 1993

[54] COMPANDOR WITH DC-COUPLED COMPRESSOR

[75] Inventors: Scott K. Bader, Mesa; David M. Susak, Chandler, both of Ariz.

[73] Assignee: Motorola, Inc., Schaumburg, Ill.

[21] Appl. No.: 898,275

[22] Filed: Jun. 15, 1992

[51] Int. Cl.⁵ .............................................. H03G 7/00
[52] U.S. Cl. ...................................... 333/14; 381/106
[58] Field of Search .......................... 333/14; 381/106; 455/72; 379/58, 61

[56] References Cited

U.S. PATENT DOCUMENTS

| | | | |
|---|---|---|---|
| 4,878,031 | 10/1989 | Main | 330/254 |
| 5,012,139 | 4/1991 | Susak et al. | 307/490 |
| 5,079,517 | 1/1992 | Bader | 330/285 |
| 5,179,361 | 1/1993 | Navid et al. | 333/14 |

*Primary Examiner*—Paul Gensler
*Attorney, Agent, or Firm*—Robert D. Atkins

[57] ABSTRACT

A compandor circuit uses a DC-coupled compressor to reduce the required IC package size to 8-pins. A delta gain stage and rectifier in the feedback path of the compressor circuit receive the AC and DC components of the compressed analog output signal. Features of the delta gain stage and rectifier eliminate the need for any AC-coupling capacitors in the feedback path thereby reducing the number of external components. The remaining external components may be made smaller and manufactured as surface mount devices. An expandor circuit receives a second compressed analog signal and expands it to full amplitude dynamic range.

17 Claims, 4 Drawing Sheets

COMPANDOR WITH DC-COUPLED COMPRESSOR

BACKGROUND OF THE INVENTION

The present invention relates in general to compandors and, more particularly, to a compandor with a DC-coupled compressor.

A compandor is a combination compressor circuit and expandor circuit. The compressor circuit compresses the dynamic range of an analog input signal for transmission across a narrow-band transmission link, while the expandor circuit expands the compressed signal back to its original state at the receiver side. Typical applications include cordless telephones and intercom systems. The compressor narrows the dynamic range of the analog input signal by amplifying frequency components below a predetermined amplitude threshold while attenuating frequency components above the amplitude threshold. For example, if the amplitude threshold is established at −20 dBV and the compressor narrows the dynamic range by a 2-to-1 dB ratio, signal components in the −80 dBV range are amplified to −50 dBV while the higher level 0 dBV components are attenuated to −10 dBV. As a result, the amplitude of the analog input signal after compression ranges from −10 dBV to −50 dBV over the entire frequency range. Following transmission over the RF link, the compressed signal is expanded to its original range of 0 dBV to −80 dBV.

One advantage of the compandor is that narrowing the dynamic range allows transmission over the RF link without clipping the frequency components with a higher amplitude. Transmission over a cordless telephone for example is typically limited to 400 millivolts peak-to-peak, while active voice signals usually range from 0 dBV to −30 dBV. A 0 dB signal would be clipped over the RF link thereby losing transmission data. Another advantage is that amplifying the low level frequency components of the input signal in the −40 to −60 dBV range raises the input signal above the noise level of the transmission link and improves the signal to noise ratio (SNR). The noise floor of a typical RF link is −50 dBv. Hence, the lowest level input signal of −80 dBV is amplified to at least the anticipated level of the transmission noise.

Compandor circuits in the prior art manufactured as a monolithic integrated circuit (IC) require packages with 12 or more pins to accommodate the necessary external components on a printed circuit board, i.e., large electrolytic capacitors. In the highly competitive market of cordless telephones, reducing the external pin count and package size can lead to reduced manufacturing costs, reduced space allocation and increased reliability.

Hence, a need exists for a compandor circuit requiring fewer external components and therefore manufacturable in a cheaper monolithic integrated circuit package with fewer external pins.

SUMMARY OF THE INVENTION

Briefly stated, the invention comprises a circuit including an amplifier having a first input receiving an input signal having AC and DC components, a second input receiving a reference potential, and an output for providing an output signal having AC and DC components. A delta gain stage includes an input coupled for receiving the AC and DC components of the output signal of the amplifier and an output coupled to the first input of the amplifier. A rectifier circuit includes an input coupled for receiving the AC and DC components of the output signal of the amplifier and an output for providing a control signal to the control input of the delta gain stage.

DETAILED DESCRIPTION OF THE PRIOR ART

Figure 1:
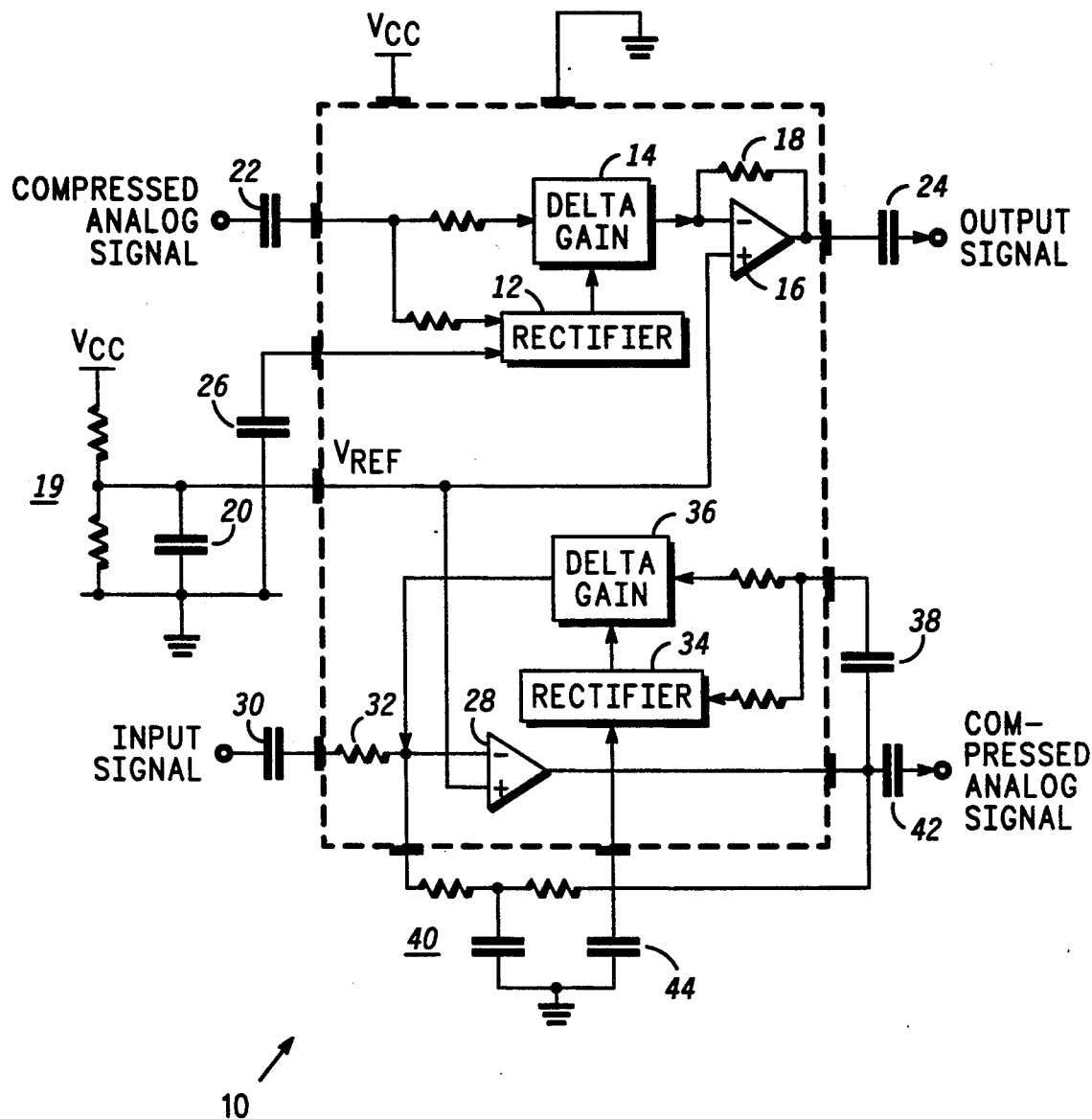
FIG. 1 is a schematic and block diagram illustrating a conventional compandor circuit.

A conventional compandor circuit 10 includes an expandor and a compressor as shown in FIG. 1. In a cordless telephone application for example, the hand-held remote unit and the base unit connected to the hard-wired telephone line would each have compandor combination. Incoming voice data from the hard-wired telephone line is compressed in the compressor of the base unit, FM modulated and transmitted through the base unit antenna over the RF link to the hand-held remote unit. The expandor in the remote unit returns the voice data to its full dynamic range for the user to hear. The voice data generated by the user with the hand-held remote unit is compressed by the compressor in the remote unit, FM modulated and transmitted through its antenna over the RF link back to the base unit where the voice data is expanded for transmission over the hard-wire telephone lines to the party at the other end.

The prior art expandor shown in FIG. 1 receives a compressed analog signal from which rectifier 12 creates a DC representation of the analog signal to control delta gain stage 14. The greater the amplitude of the compressed analog signal, the higher the gain through delta gain stage 14. Conversely, the lower the compressed analog signal, the lower the gain through delta gain stage 14. Amplifier 16 with feedback resistor 18 provides an output signal having full dynamic range. The non-inverting input of amplifier 16 receives a reference potential $V_{REF}$ typically operating at one-half the positive power supply potential $V_{CC}$ through resistor divider network 19 and filter capacitor 20. The expandor operation typically requires four external pins for the IC package, one each for connection of external capacitors 20, 22, 24, and 26.

For the compressor circuit shown in FIG. 1, the feedback components around amplifier 28 are exchanged with respect to amplifier 16, whereby a full dynamic range input signal is applied through capacitor 30 and resistor 32 to the inverting input of amplifier 28, while rectifier 34 and delta gain stage 36 operate in the feedback path between the output of amplifier 28 and its inverting input. Again, the non-inverting input of amplifier 28 receives the reference potential $V_{REF}$ from resistor divider network 19. Rectifier 34 and delta gain stage 36 receive the output signal of amplifier 28 and adjust the gain based on a compressed analog signal. That is, the higher the compressed analog signal the lower the gain, and the lower the compressed analog signal the higher the gain, thereby effectively compressing the input signal and limiting its dynamic range. Delta gain stage 36 in the compressor tracks delta gain stage 14 in the expandor.

Rectifier 34 and delta gain stage 36 in prior art compressor circuits are sensitive to DC signals from amplifier 28. Capacitor 38 AC-couples the compressed analog signal to delta gain stage 36 to remove any DC component which may adversely effect the feedback path. However, because capacitor 38 decouples DC signals from the feedback path it is necessary to add the RC network 40 to provide a DC bias for the inverting input of amplifier 28. The IC package for the compressor function requires five external pins for capacitors 30, 38, 42 and 44 and RC network 40, in addition to the $V_{REF}$ pin which is also used in the expandor as previously discussed.

The IC package for the complete compandor circuit therefore requires eleven external pins, five pins for the compressor function, three pins for the expandor function and three pins for $V_{CC}$ and ground operating potentials and the reference potential $V_{REF}$. A smaller standard package size is an eight-pin SOI package. Reducing the compandor function to only eight external pins offers a desirable reduction in manufacturing costs, fewer external components and overall improvement in reliability.

DETAILED DESCRIPTION OF THE PREFERRED EMBODIMENT

Figure 2:
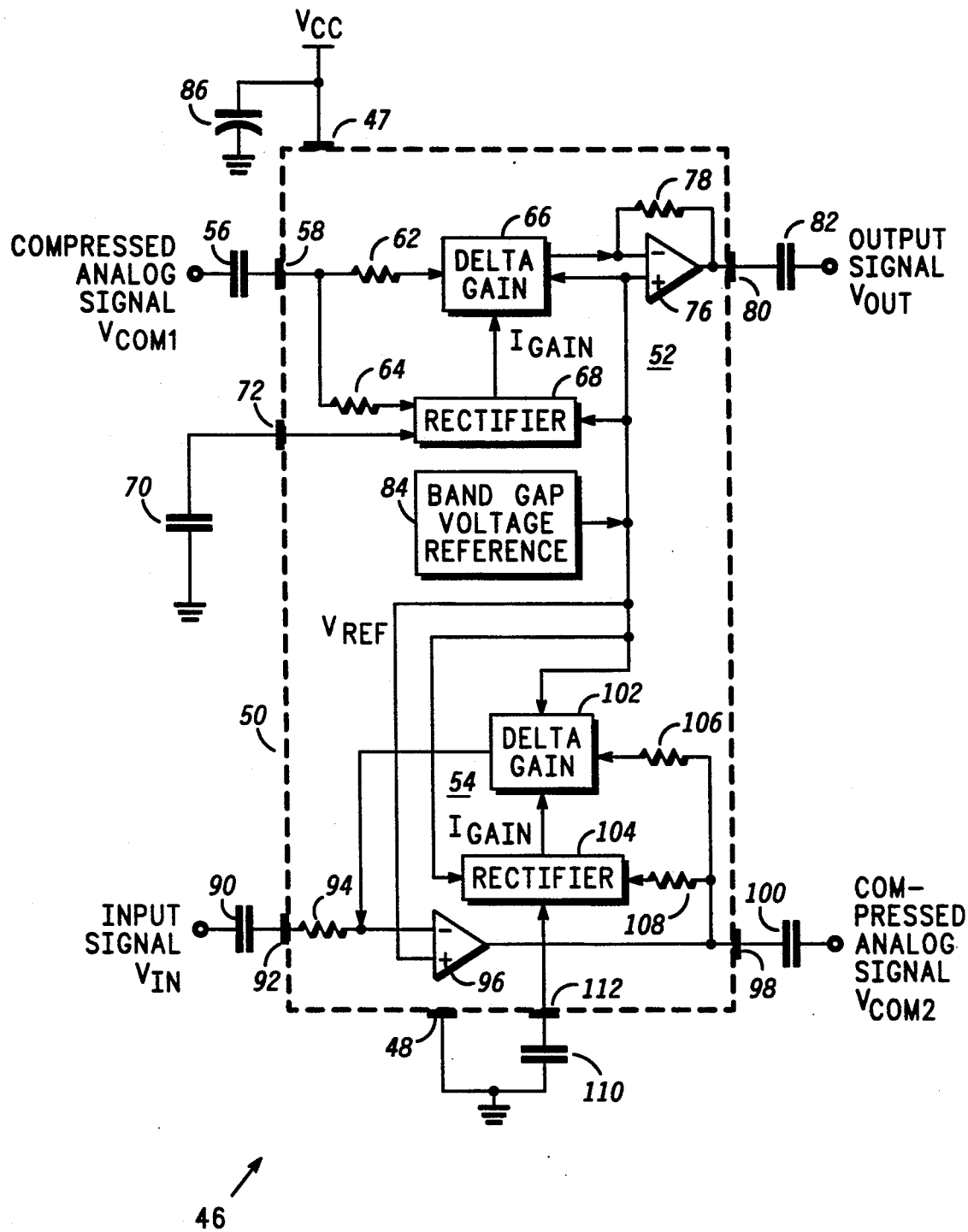
FIG. 2 is a schematic and block diagram illustrating a compandor circuit in accordance with the present invention.

A compandor circuit 46 includes an expandor 52 and a compressor 54 as shown in FIG. 2 suitable for manufacturing as an 8-pin integrated circuit package using conventional integrated circuit processes. A positive power supply potential $V_{CC}$ (5.0 volts) and ground potential are applied through pins 47 and 48 to IC 50. First consider expandor 52 where a compressed analog signal $V_{COM1}$ is applied through external AC-coupling capacitor 56 to pin 58 of IC 50. The AC components of the compressed analog signal $V_{COM1}$ continue through resistors 62 and 64 to delta gain stage 66 and rectifier 68, respectively. Rectifier 68 produces a DC control signal $I_{GAIN}$ representative of the compressed analog signal $V_{COM1}$ to control the gain of delta gain stage 66. External capacitor 70 is coupled through pin 72 of IC 50 to rectifier 68. The greater the amplitude of the compressed analog signal $V_{COM1}$, the higher the gain through delta gain stage 66. Conversely, the lower the compressed analog signal $V_{COM1}$, the lower the gain through delta gain stage 66. Expandor 66 thus expands the compressed analog signal $V_{COM1}$ to its full amplitude dynamic range. Further detail of delta gain stage 66 and rectifier 68 is provided in FIGS. 3 and 4, respectively.

Operational amplifier 76 includes an inverting input coupled for receiving an output signal of delta gain stage 66, and a non-inverting input coupled for receiving a reference potential $V_{REF}$. Resistor 78 is coupled in the feedback path between the output of amplifier 76 and its inverting input. The output of amplifier 76 provides an output signal $V_{OUT}$ through pin 80 and capacitor 82 operating with full amplitude dynamic range following decompression through expandor 52.

Compandor 46 includes a bandgap voltage reference circuit 84 producing a bandgap-regulated reference voltage $V_{REF}$ operating at 1.5 volts. The 1.5 volt operating point for the reference voltage $V_{REF}$ allows an industry standard 2.8 volt peak-to-peak swing in the output signal $V_{OUT}$. Bandgap voltage reference circuit 84 eliminates the need for a large filter capacitor like 20 in FIG. 1, and associated IC pin, thereby reducing the space requirement and allowing integration of the voltage reference circuit within IC 50. Furthermore, decoupling capacitor 86 coupled to $V_{CC}$ may be made smaller since the inherent features of a bandgap voltage reference make it less susceptible to power supply variation.

Compressor 54 of FIG. 2 receives an analog input signal $V_{IN}$ applied through external AC-coupling capacitor 90 to pin 92 of IC 50. The AC components of the analog input signal $V_{IN}$ continue through resistor 94 to the inverting input of operational amplifier 96. The noninverting input of amplifier 96 receives the bandgap reference voltage $V_{REF}$. The output of amplifier 96 provides the compressed analog signal $V_{COM2}$ through pin 98 and external capacitor 100. Capacitors 56, 70, 82, 90, 100 and 110 may be surface mount devices.

Another key feature of the present invention is the elimination of external capacitor 38 and RC network 40 and the two associated IC pins in FIG. 1. The output of amplifier 96 is DC-coupled to delta gain stage 102 and rectifier 104, that is, the AC and DC components of the output signal of amplifier 96 are applied to delta gain stage 102 and rectifier 104. Certain features of delta gain stage 102 and rectifier 104 allow compandor 46 to operate with DC-coupled compressor 54 as described hereinafter. Eliminating certain external components allows compandor 46 to be manufactured in an 8-pin SOI IC package with the remaining external components as surface mount devices.

Delta gain stage 102 and rectifier 104 are coupled in the feedback path between the output of amplifier 96 and its inverting input. The output signal of amplifier 96 is applied through resistors 106 and 108 to delta gain stage 102 and rectifier 104, respectively. Rectifier 104 produces a DC control signal $I_{GAIN}$ representative of the compressed analog signal $V_{COM2}$ to control the gain of delta gain stage 102. That is, the higher the compressed analog signal $V_{COM2}$ the lower the gain, and the lower the compressed analog signal $V_{COM2}$ the higher the gain, thereby effectively compressing the input signal $V_{IN}$ and limiting its dynamic range. External capacitor 110 is coupled through pin 112 of IC 50 to rectifier 104. Delta gain stage 102 and rectifier 104 shown in FIGS. 3 and 4, respectively, follow the same construction as delta gain stage 66 and rectifier 68.

Figure 3:
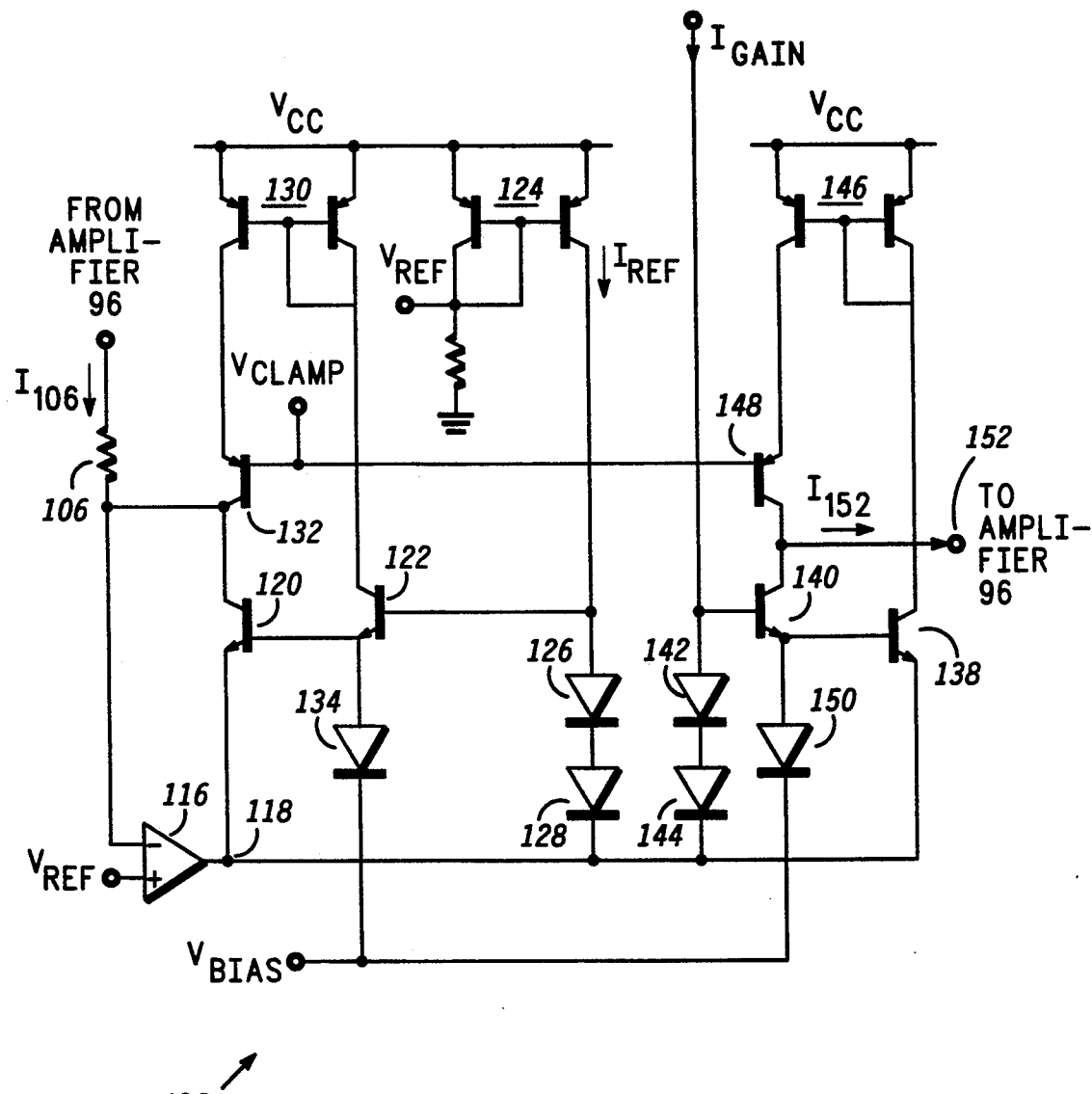
FIG. 3 is a schematic diagram illustrating the delta gain stage of FIG. 2.

Turning to FIG. 3, delta gain stage 102 is shown in further detail. The operation of a variable gain amplifier like delta gain stage 102 is described in U.S. Pat. No. 4,878,031, entitled CLASS B VARIABLE GAIN CONTROL CIRCUIT, hereby incorporated by reference. When a positive going current $I_{106}$ flows through resistor 106 from FIG. 2, the inverting input of operational amplifier 116 goes high and its output goes low at node 118 turning on transistor 120 to a sufficient level to sink current $I_{106}$. A constant reference current $I_{REF}$ is generated by reference voltage $V_{REF}$ applied to current mirror circuit 124. Reference current $I_{REF}$ flows through diodes 126 and 128. The base-emitter junction potential ($V_{be}$) of transistor 122 thus decreases by the same amount that the $V_{be}$ of transistor 120 increases because the sum of the $V_{be}$'s of transistors 120 and 122 must equal the potentials across diodes 126 and 128. Diode 134 maintains the emitter of transistor 122 at one diode potential above bias potential $V_{BIAS}$ typically set at $0.5 * V_{be}$.

A smaller $V_{be}$ for transistor 122 reduces the current flow through current mirror circuit 130 to match the increase in current $I_{106}$ summing at the collector of transistor 132. The base of transistor 132 receives bias voltage $V_{CLAMP}$ to limit the collector voltage of the output transistor of current mirror 130 so the beta and Early effects are minimized to give excellent DC current match and no gain degradation of the AC signal. Thus, amplifier 116 establishes the proper voltage at node 118 such that the current through transistor 132 plus current $I_{106}$ equals the current through transistor 120.

The operation of transistors 120-132 is similar to transistors 138-150 with the exception that diodes 142-144 receive DC gain control current $I_{GAIN}$ from rectifier 104. Current $I_{GAIN}$ controls the potentials developed across diodes 142-144 and correspondingly the amount of decrease in current through transistor 140 induced by an increase in current through transistor 138. The resulting current $I_{152}$ flowing out of delta gain stage 102 into the inverting input of amplifier 96 is given as $I_{152} = I_{106} * I_{GAIN}/I_{REF}$. The operation of delta gain stage 102 is insensitive to DC signals because the DC currents flowing through the input and output of current mirror 146 are identical to the currents flowing through transistor 140 and 138 so that the net DC current summing into output 152 is zero.

Figure 4:
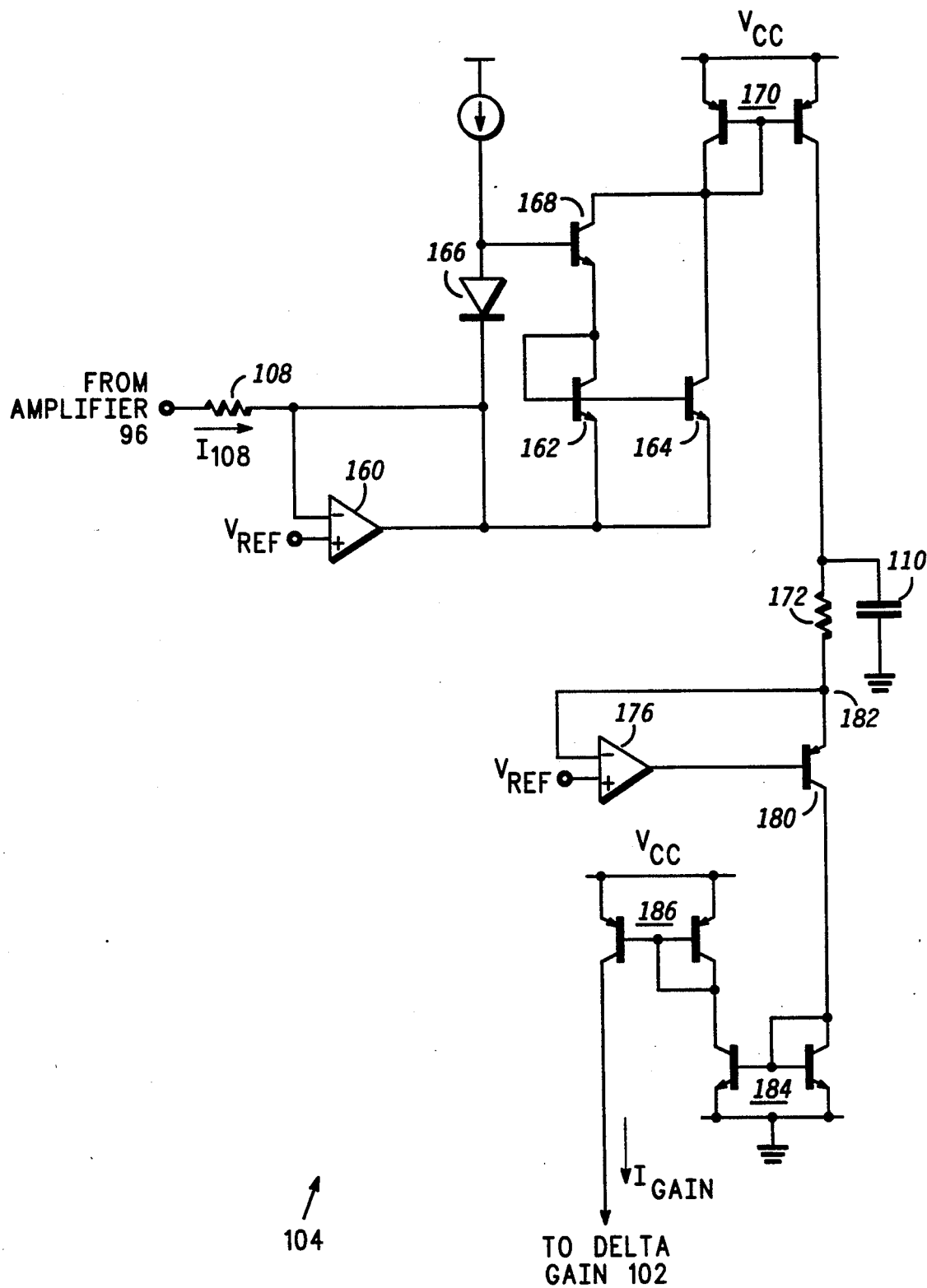
FIG. 4 is a schematic diagram illustrating the rectifier circuit of FIG. 2.

In FIG. 4, rectifier 104 is shown in further detail. The operation of a rectifier like rectifier 104 is described in U.S. Pat. No. 5,012,139, entitled FULL WAVE RECTIFIER/AVERAGING CIRCUIT, and U.S. Pat. No. 5,079,517, entitled CIRCUIT FOR DC CONTROL OF A COMPRESSOR, hereby incorporated by reference. A positive AC current flowing through resistor 108 from FIG. 2 pulls the output of amplifier 160 low and turns on transistors 162 and 164. Diode 166 develops substantially the same potential as diode-configured transistor 162 and turns off transistor 168 because of equal potentials at its base and emitter. Current mirror circuit 170 conducts the same current as transistor 164. During the negative cycle of the AC current, transistor 168 conducts and transistor 164 turns off. Thus, transistor 164 conducts during the positive portion of the AC current cycle and transistor 168 conducts during the negative portion, producing a fullwave rectified signal flowing into current mirror circuit 170. Resistor 172 and capacitor 110 (from FIG. 2) average the fullwave rectified signal producing a DC signal at the inverting input of operational amplifier 176. The output of amplifier 176 drives transistor 180 to create a low impedance at node 182. The DC signal passes through current mirror circuits 184 and 186 to produce the DC control signal $I_{GAIN}$ for delta gain stage 102.

A key feature of the present invention is the elimination of certain components external to the compandor IC (e.g., capacitor 38 and RC network 40 of FIG. 1), thereby allowing a smaller package size (e.g., 8-pin SOI). The delta gain stage and rectifier in the feedback path of the compressor circuit no longer require an AC-coupling capacitor and RC network for DC bias because the delta gain stage and rectifier are insensitive to DC signals. Moreover, the remaining external components may be made smaller and manufactured as surface mount devices.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A circuit, comprising:
   an amplifier having first and second inputs and an output, said first input receiving an input signal having AC and DC components, said second input receiving a reference potential, said output producing an output signal having AC and DC components;
   a delta gain stage having an input, a control input and an output, said input being coupled for receiving said AC and DC components of said output signal of said amplifier by way of a first DC conduction path, said output being coupled to said first input of said amplifier; and
   a rectifier circuit having an input coupled for receiving said AC and DC components of said output signal of said amplifier by way of a second DC conduction path and having an output for providing a control signal to said control input of said delta gain stage.

2. The circuit of claim 1 comprising a bandgap voltage reference circuit having an output for providing said reference potential.

3. The circuit of claim 1 further including:
   a first capacitor having a first terminal coupled for receiving said input signal having AC and DC components and having a second terminal; and
   a first resistor coupled between said second terminal of said first capacitor and said first input of said amplifier.

4. The circuit of claim 3 further including:
   a second resistor coupled between said output of said amplifier and said input of said delta gain stage; and
   a third resistor coupled between said output of said amplifier and said input of said rectifier circuit.

5. A compandor circuit in an 8-pin integrated circuit (IC) package, comprising:
   a first amplifier having first and second inputs and an output, said first input receiving an input signal from a first pin of the IC, said second input receiving a reference potential, said output producing a first compressed analog signal having AC and DC components at a second pin of the IC;
   a first delta gain stage having an input, a control input and an output, said input being coupled for receiving said first compressed analog signal having AC and DC components by way of a first DC conduction path, said output being coupled to said first input of said first amplifier;
   a first rectifier circuit having first and second inputs and an output, said first input being coupled for receiving said first compressed analog signal having AC and DC components by way of a second DC conduction path, said second input being coupled to a third pin of the IC, said output providing a first control signal to said control input of said first delta gain stage; and
   an expandor circuit having an input coupled for receiving a second compressed analog signal at a fourth pin of the IC and having an output for providing an output signal at a fifth pin of the IC.

6. The circuit of claim 5 comprising a bandgap voltage reference circuit having an output for providing said reference potential.

7. The compandor circuit of claim 5 wherein said output signal of said first amplifier includes AC and DC components applied at said input of said first delta gain stage and said first input of said first rectifier circuit.

8. The compandor circuit of claim 7 further including a first external capacitor coupled between said third pin of the IC and a first power supply conductor.

9. The circuit of claim 8 wherein said expandor circuit includes:

a second amplifier having first and second inputs and an output, said second input receiving said reference potential, said output producing said output signal of said expandor circuit at said fifth pin of the IC;

a second delta gain stage having an input, a control input and an output, said input being coupled for receiving said second compressed analog signal, said output being coupled to said first input of said second amplifier;

a second rectifier circuit having first and second inputs and an output, said first input being coupled for receiving said second compressed analog signal, said second input being coupled to a sixth pin of the IC, said output providing a second control signal to said control input of said second delta gain stage; and a first resistor coupled between said output of said second amplifier and said first input of said second amplifier.

10. The compandor circuit of claim 9 further including a second external capacitor coupled between said sixth pin of the IC and said first power supply conductor.

11. The compandor circuit of claim 10 wherein the 8-pin IC includes:

a seventh pin coupled to said first power supply conductor; and an eighth pin coupled to a second power supply conductor.

12. The compandor circuit of claim 11 further including:

a third external capacitor having a first terminal coupled to said first pin of the IC and having a second terminal coupled for receiving said input signal;

a fourth external capacitor having a first terminal coupled to said second pin of the IC and having a second terminal coupled for providing said first compressed analog signal;

a fifth external capacitor having a first terminal coupled to said fourth pin of the IC and having a second terminal coupled for receiving said second compressed analog signal; and a sixth external capacitor having a first terminal coupled to said fifth pin of the IC and having a second terminal coupled for providing said output signal.

13. A compandor circuit, comprising:

a first amplifier having first and second inputs and an output, said first input receiving an input signal having AC and DC components, said second input receiving a reference potential, said output producing a first compressed analog signal having AC and DC components;

a first delta gain stage having an input, a control input and an output, said input being coupled for receiving said first compressed analog signal having AC and DC components by way of a first DC conduction path, said output being coupled to said first input of said first amplifier;

a first rectifier circuit having a first input and an output, said first input being coupled for receiving said first compressed analog signal having AC and DC components by way of a second DC conduction path, said output providing a first control signal to said control input of said first delta gain stage; and an expander circuit having an input coupled for receiving a second compressed analog signal and having an output for providing an output signal.

14. The compandor circuit of claim 13 further including a first external capacitor coupled between a second input of said first rectifier circuit and a first power supply conductor.

15. The compandor circuit of claim 14 wherein said expandor circuit includes:

a second amplifier having first and second inputs and an output, said second input receiving said reference potential, said output producing said output signal of said expandor circuit;

a second delta gain stage having an input, a control input and an output, said input being coupled for receiving said second compressed analog signal, said output being coupled to said first input of said second amplifier;

a second rectifier circuit having a first input and an output, said first input being coupled for receiving said second compressed analog signal, said output providing a second control signal to said control input of said second delta gain stage; and a first resistor coupled between said output of said second amplifier and said first input of said second amplifier.

16. The compandor circuit of claim 15 further including a second external capacitor coupled between a second input of said second rectifier circuit and said first power supply conductor.

17. The compandor circuit of claim 13 comprising a bandgap voltage reference circuit having an output for providing said reference potential.

* * * * *